(12) United States Patent
Kelkar et al.

(10) Patent No.: US 8,951,847 B2
(45) Date of Patent: Feb. 10, 2015

(54) PACKAGE LEADFRAME FOR DUAL SIDE ASSEMBLY

(75) Inventors: Nikhil Vishwanath Kelkar, Saratoga, CA (US); Kai Liu, Mountain View, CA (US)

(73) Assignee: Intersil Americas LLC, Milpitas, CA (US)

( * ) Notice: Subject to any disclaimer, the term of this patent is extended or adjusted under 35 U.S.C. 154(b) by 96 days.

(21) Appl. No.: 13/611,754

(22) Filed: Sep. 12, 2012

(65) Prior Publication Data

US 2013/0181332 A1  Jul. 18, 2013

Related U.S. Application Data

(60) Provisional application No. 61/604,881, filed on Feb. 29, 2012, provisional application No. 61/587,910, filed on Jan. 18, 2012.

(51) Int. Cl.
*H01L 21/44* (2006.01)
*H01L 21/48* (2006.01)

(52) U.S. Cl.
USPC ..... 438/123; 438/617; 257/666; 257/E21.509

(58) Field of Classification Search
CPC ..... H01L 24/06; H01L 24/49; H01L 23/3107; H01L 23/3121; H01L 2224/92247
USPC ................. 438/123, 617; 257/666, E21.509
See application file for complete search history.

(56) References Cited

U.S. PATENT DOCUMENTS

| 4,873,615 A | 10/1989 | Grabbe |
| 4,903,114 A | 2/1990 | Aoki et al. |
| 5,049,977 A | 9/1991 | Sako |
| 5,084,753 A | 1/1992 | Goida et al. |
| 5,096,852 A | 3/1992 | Hobson |
| 5,124,783 A | 6/1992 | Sawaya |
| 5,196,992 A | 3/1993 | Sawaya |
| 5,245,215 A | 9/1993 | Sawaya |
| 5,245,216 A | 9/1993 | Sako |
| 5,325,268 A | 6/1994 | Nachnani et al. |
| 5,347,429 A | 9/1994 | Kohno et al. |
| 5,352,632 A | 10/1994 | Sawaya |
| 5,362,984 A | 11/1994 | Konda et al. |
| 5,373,188 A | 12/1994 | Michii et al. |

(Continued)

FOREIGN PATENT DOCUMENTS

| JP | 60160134 | 8/1985 |
| JP | 1105551 | 4/1989 |

(Continued)

OTHER PUBLICATIONS

Albalak, "Package Singulation Processes", 2011, pp. 1-2, Publisher: Information Communication Technology.

(Continued)

*Primary Examiner* — Nitin Parekh
(74) *Attorney, Agent, or Firm* — Fogg & Powers LLC

(57) ABSTRACT

Embodiments of a leadframe for a device packaging are used not only for structural support and connectivity to the I/O pins to the external world, but also for housing and/or mounting devices above and below the leadframe. Being electrically conductive, the leadframe also serves as a low resistance interconnect and good current carrier between the bondpads on one device or between the bondpads on different devices above and/or below the leadframe.

11 Claims, 12 Drawing Sheets

(56) References Cited

U.S. PATENT DOCUMENTS

| | | | |
|---|---|---|---|
| 5,408,127 A | 4/1995 | Mostafazadeh | |
| 5,451,814 A | 9/1995 | Yoshimizu | |
| 5,530,282 A | 6/1996 | Tsuji | |
| 598,038 A | 1/1997 | Sugano | |
| 5,606,710 A | 2/1997 | Hall et al. | |
| 5,625,235 A | 4/1997 | Takiar | |
| 5,637,915 A * | 6/1997 | Sato et al. | 257/666 |
| 5,703,399 A | 12/1997 | Majumdar et al. | |
| 5,714,405 A * | 2/1998 | Tsubosaki et al. | 438/118 |
| 5,719,436 A | 2/1998 | Kuhn | |
| 5,767,573 A | 6/1998 | Noda et al. | |
| 5,789,816 A | 8/1998 | Wu | |
| 5,894,165 A * | 4/1999 | Ma et al. | 257/666 |
| 5,965,947 A | 10/1999 | Nam et al. | |
| 6,016,256 A | 1/2000 | Crane, Jr. et al. | |
| 6,066,515 A * | 5/2000 | Schoenfeld | 438/123 |
| 6,066,890 A | 5/2000 | Tsui et al. | |
| 6,072,243 A | 6/2000 | Nakanishi | |
| 6,075,284 A * | 6/2000 | Choi et al. | 257/676 |
| 6,078,514 A | 6/2000 | Takemae et al. | |
| 6,133,637 A | 10/2000 | Hikita et al. | |
| 6,159,765 A | 12/2000 | Drehobl et al. | |
| 6,255,736 B1 | 7/2001 | Kaneko | |
| 6,266,246 B1 | 7/2001 | Crane, Jr. et al. | |
| 6,307,755 B1 | 10/2001 | Williams et al. | |
| 6,333,549 B2 | 12/2001 | Drehobl et al. | |
| 6,337,510 B1 * | 1/2002 | Chun-Jen et al. | 257/666 |
| 6,421,254 B2 | 7/2002 | Crane, Jr. et al. | |
| 6,458,609 B1 | 10/2002 | Hikita et al. | |
| 6,780,680 B2 * | 8/2004 | Schoenfeld | 438/123 |
| 7,923,300 B2 | 4/2011 | Bell et al. | |
| 7,948,067 B2 | 5/2011 | Fouquet et al. | |
| 7,981,702 B2 * | 7/2011 | Ho et al. | 438/15 |
| 8,035,221 B2 | 10/2011 | Cruz | |
| 8,105,880 B2 * | 1/2012 | Griffin | 438/118 |
| 8,580,609 B2 * | 11/2013 | Xiao et al. | 438/107 |
| 2002/0180021 A1 | 12/2002 | Lin et al. | |
| 2007/0052079 A1 | 3/2007 | Tsai et al. | |
| 2008/0044946 A1 * | 2/2008 | Cruz et al. | 438/107 |
| 2008/0142679 A1 | 6/2008 | Grandjean et al. | |
| 2009/0059546 A1 | 3/2009 | Xing | |
| 2009/0127676 A1 * | 5/2009 | Gomez | 257/666 |
| 2010/0109135 A1 * | 5/2010 | Jereza | 257/676 |
| 2010/0173454 A1 * | 7/2010 | Chong et al. | 438/109 |
| 2011/0163434 A1 | 7/2011 | Bell et al. | |

FOREIGN PATENT DOCUMENTS

| | | |
|---|---|---|
| JP | 3050842 | 3/1991 |
| JP | 4144142 | 5/1992 |
| JP | 5335469 | 12/1993 |
| JP | 8288453 | 11/1996 |
| JP | 2001523400 | 11/2001 |
| WO | 9405038 | 3/1994 |

OTHER PUBLICATIONS

"CSP(lead-frame) package sideview.png", Jan. 16, 2012, pp. 1-5, Publisher: http://ja.wikipedia.org/wiki/%E3%83%95%E3%82%A1%E3%8... Jan. 16, 2012.

"Die attach", "Chapter 4 packaging process overview 4.5", Mar. 2010, p. 1, Publisher: IC Knowledge LLC.

"Die Stacking", Jan. 17, 2012, pp. 1-2, Publisher: http://www.siliconfareast.com/diestacking.htm Jan. 17, 2012.

"Integrated Circuit Packaging", "http://webcache.googleusercontent.com/search?q=cache:5_yozkl... Jan. 18, 2012", pp. 1-5, Publisher: Wikipedia.

"Lead Frame definition of lead frame in the Free Online Encyclopedia ", Jan. 16, 2012, Publisher: http://encyclopedia2.thefreedictionary.com/lead+frame accessed Jan. 16, 2012.

"Lead Frame Images Google Search", Jan. 19, 2012, pp. 1-5, Publisher: http://www.google.com/search?q=lead+frame+images&h1=en&p... Jan. 19, 2012.

Moll et al., "Advanced IC Packaging a Technology Overview", Jul. 2004, pp. 1-25, Publisher: Cadence.

Jan. 18, 2012, p. 1, Publisher: www.psinter.com/images/practical/qfp_pq2_cross.gif.

"Multilayer Lead Frame", Jan. 16, 2012, pp. 1-4, Publisher: http://www.shinko.co.jp/english/product/leadframe/multilayer.html Jan. 16, 2012.

Anderson, "Wire Bonding Dual-Sided MCM-L Modules", "MCM '94 Proceedings", Apr. 1994, pp. 424-429.

Garrou et al., "Multichip Module Technology Handbook", "Published at least as early as Dec. 1998", 1998, pp. 1-46, Publisher: McGraw-Hill.

Langenkamp et al, "A Low-Cost MCM Implementation for 100-Hz TV Up-conversion", Apr. 1998, pp. 537-542.

"Multi-Chip Packages", Apr. 2000, pp. 1-3, Publisher: National Semiconductor.

Nachnani et al., "A Low-Cost Multichip (MCM-L) Packaging Solution", Oct. 1993, pp. 464-468.

Thompson, "Reliability Development and Qualification of a Low-Cost PQFP-Based MCM", "IEEE Transactions on Components, Packaging, and Manufacturing Technology", Mar. 1995, pp. 10-14, vol. 18, No. 1.

Thompson, "MCM-L Product Development Process for Low-Cost MCM's", Feb. 1995, pp. 9-12, vol. 18, No. 1.

* cited by examiner

US 8,951,847 B2

PACKAGE LEADFRAME FOR DUAL SIDE ASSEMBLY

CROSS REFERENCE TO RELATED APPLICATION

This application claims the benefit of prior provisional application No. 61/587,910, filed on Jan. 18, 2012, entitled "A Package Leadframe for Dual Side Assembly," the disclosure of which is incorporated herein by reference. This application also claims the benefit of prior provisional application No. 61/604,881, filed on Feb. 29, 2012, entitled "A Package Leadframe for Dual Side Assembly," the disclosure of which is incorporated herein by reference.

DRAWINGS

The following exemplary figures are intended to aid the understanding of the written description of the exemplary embodiments and should not be considered limiting in scope.

FIG. 1 is a cross sectional view of FIG. 2 at cut-line 150, but the entire bondwire is illustrated in FIG. 1 for clarity.

Figure 1:
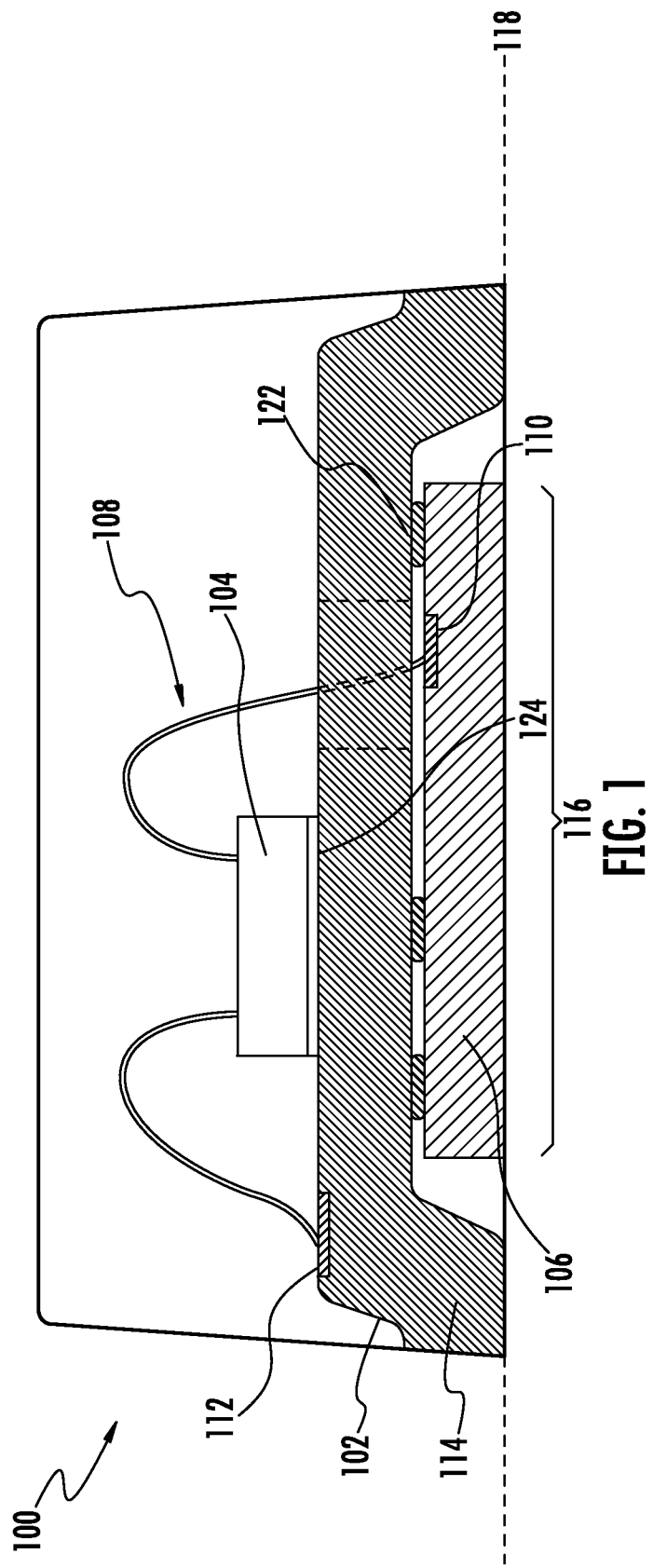
FIG. 1 depicts a side view, in cross section, of one embodiment of a packaged part showing two devices and a leadframe in between the devices.

In accordance with common practice, the various displayed features are not necessarily drawn to scale but are drawn to emphasize specific features relevant to the exemplary embodiments.

DETAILED DESCRIPTION

In the following description, reference is made to the accompanying drawings and specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following description is, therefore, not to be taken in a limiting sense.

A package houses devices so that it protects them from stress and outside elements and makes it easier to transfer signals to and from the microelectronics devices to a printed circuit board. The devices can include a variety of objects such as microelectronic devices, integrated circuits, semiconductor devices, heat slugs/thermal pads, MEMs devices, nanotechnology, and optoelectronics, passive devices or active devices and so on. For purposes of this application, elements such as bondwires, solder bumps, solder tubes, or solder paste are not considered devices when they are used only as electrical connection elements. Likewise, mechanical standoffs or other mechanical support objects are not devices. However, if the connection elements or mechanical support objects are configured to serve other purposes such as an inductor or a transmission line of a particular length, then such elements are also devices.

Figure 2:
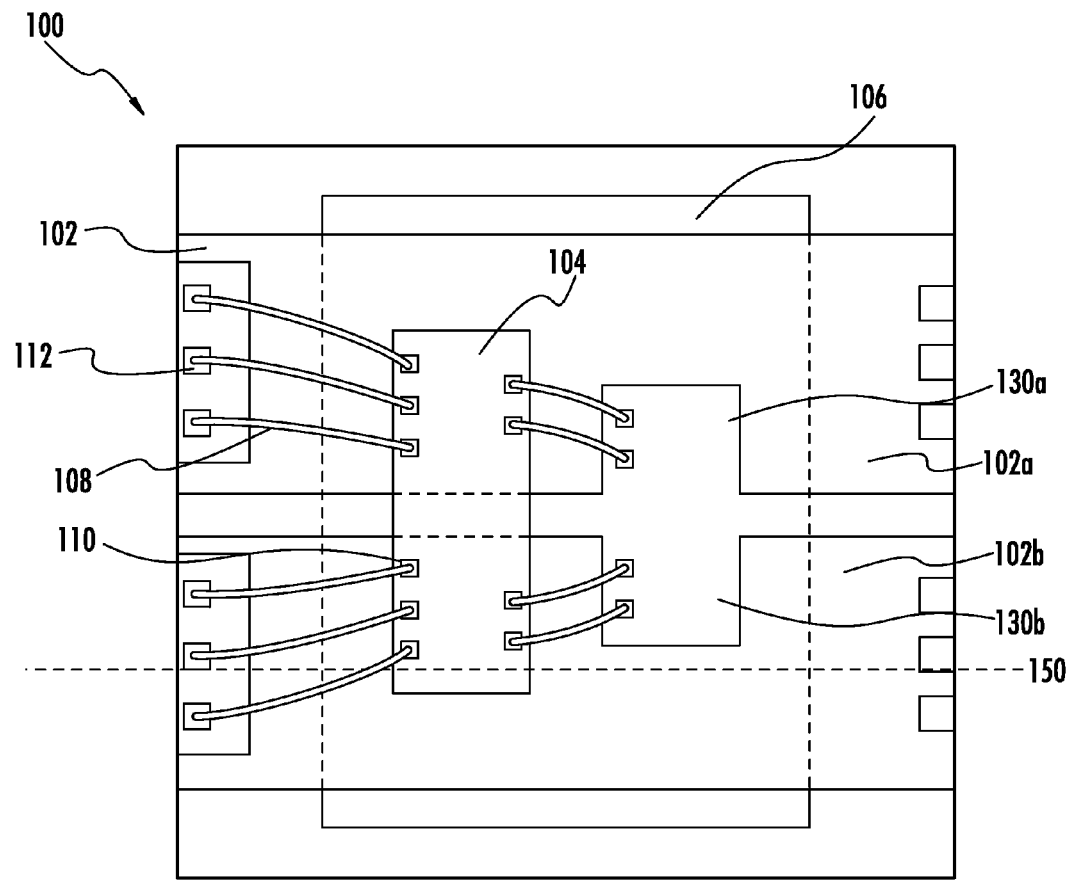
FIG. 2 is a top view of FIG. 1 and includes exemplary interconnecting bondwires.

In a first embodiment, FIG. 1 illustrates a side view of a cross section of a packaged part, structure 100, having a package leadframe 102 in between the devices 104 and 106. The leadframe 102 has a cavity or is recessed underneath the leadframe 102 so that there is vertical room to house at least one device 106. The leadframe 102 provides structural support and a framework upon which to mount the devices 104 and 106. The leadframe 102 also provides leadframe fingers 114 that connect the devices 104 and 106 to the outside world. The leadframe fingers 114 interconnect to the outside to provide signals, power and ground. As illustrated in FIG. 1, there is no central, die-attach pad or other form of package substrate as would be included in a conventional packaged part. It is noted, however, that these elements are not precluded in another embodiment. Using bondwires 108, device 104 is electrically connected to device 106 through an opening 130 in the leadframe 102. Device 104 is also electrically connected to leadframe terminals 112 on the top side of the leadframe 102. FIG. 2 shows the same embodiment, but from a top view, and the same elements are labeled accordingly.

FIG. 1 represents a cross section of FIG. 2 at dashed line 150, but the full arc of the bondwires 108 is shown in FIG. 1 for clarity. The top view shown in FIG. 2 indicates that the leadframe 102 is patterned in one example such that it comprises two halves 102a and 102b, and there are notches or openings 130a and 130b.

Figure 3:
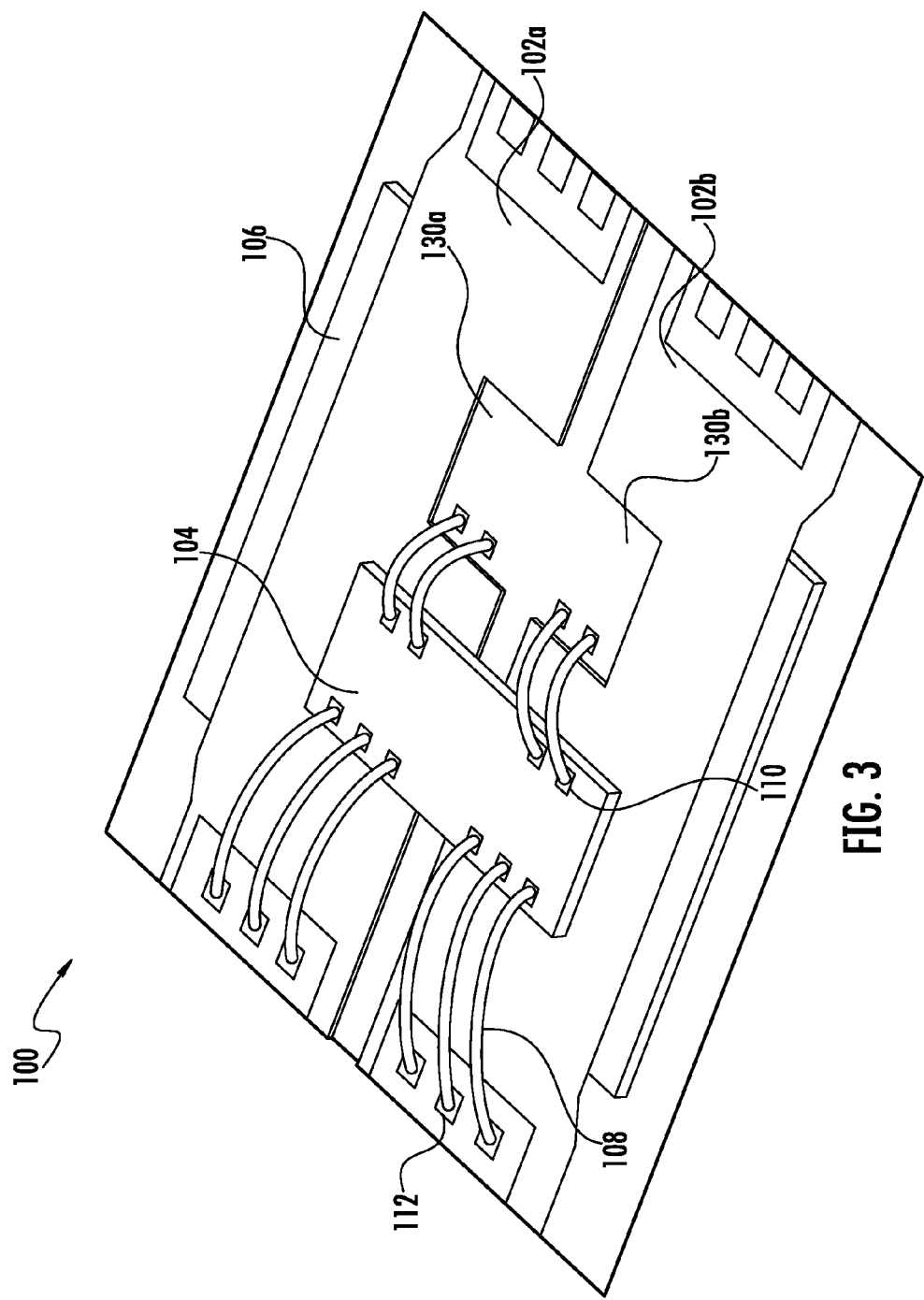
FIG. 3 is 3-dimensional perspective view of the assembly illustrated in FIGS. 1 and 2.

FIG. 3 depicts the same embodiment in a 3-dimensional view from above. The perspective in FIG. 3 indicates that device 106 is underneath the leadframe halves 102a and 102b, but it has electrical connections through the openings 130a and 130b to device 104 via bondwires 108 that are soldered on bondpads 110. Either or both devices 104 and 106 can also connect to the leadframe 102, such as through bondwires 108 soldered to terminals 112 in the case of device 104.

Figure 4:
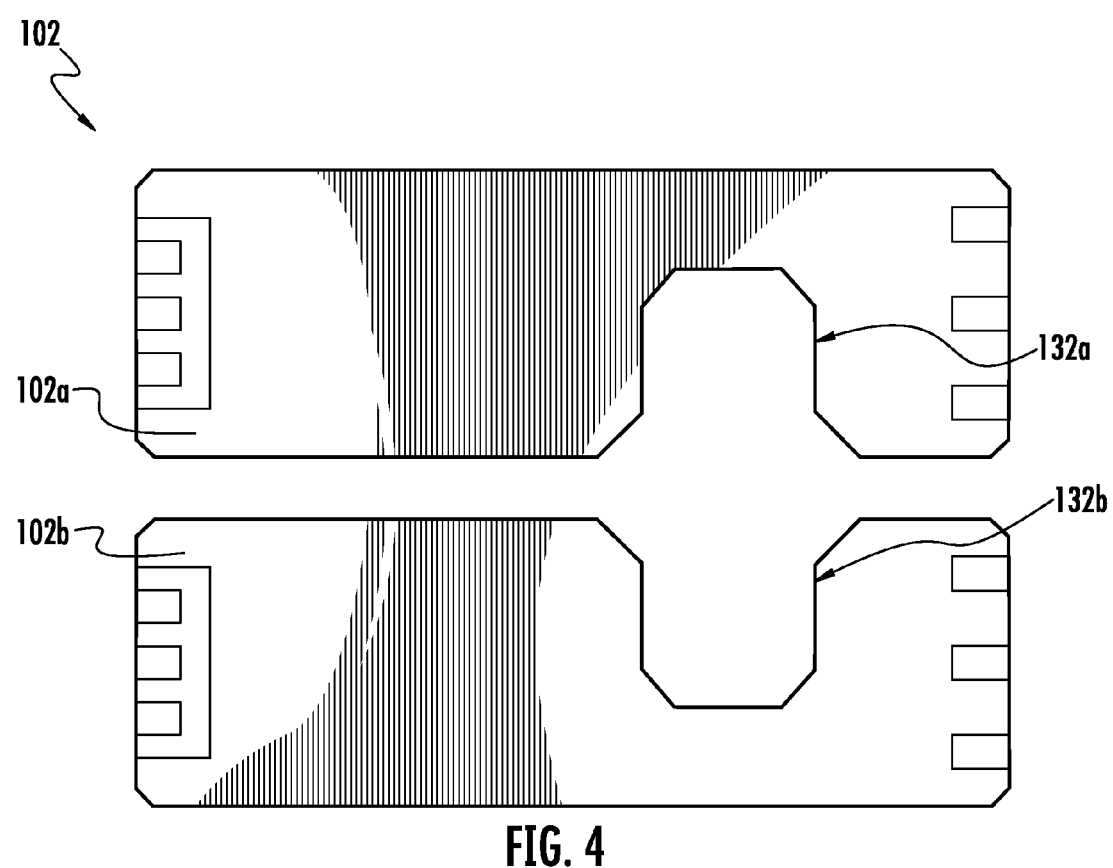
FIG. 4 depicts a top view of another embodiment of a leadframe where the leadframe openings are beveled.

The structure of FIG. 3 indicates that a conductive lead frame 102 of a packaged part 100 not only serves to mechanically support components, but is being utilized as a low resistance and low inductance interconnect, and also as a current carrier and heat dissipater. The width of the conductive leadframe halves 102a and 102b spans a significant length of the devices 104 and 106 or even spans beyond their lengths so that the resistance of the lead frame can be quite low. Current conduction and heat dissipation are significantly improved if the devices 104 and 106 contact or bond to the leadframe 102. To save costs and to be backwardly compatible with existing manufacturing tools, the leadframe 102 is made primarily of metal alloys. Alternatively, for yet lower resistance, better current conduction or thermal conduction, leadframe 102 can be made substantially of copper or be plated with gold or silver. Regardless of composition, there are other ways to further improve current conduction and prevent current congregation or sharp electric fields. For example, the sharp 90-degree corners of the cutouts 132a and 132b are beveled in another embodiment of a leadframe 102 as shown in FIG. 4.

In the embodiments such as in FIG. 3, the leadframe 102 structure advantageously saves space because of the vertical stacking of the devices 104 and 106. The structure of leadframe 102 also improves isolation and reduces noise between the devices 104 and 106. For example, if the leadframe 102 is designated as the ground signal, the metal is so wide that it provides a very quiet and solid ground that shields device 104 from device 106 and reduces interference. Further, leadframe 102 increases the packaging options and provides more flexibility in connectivity between devices.

Figure 11:
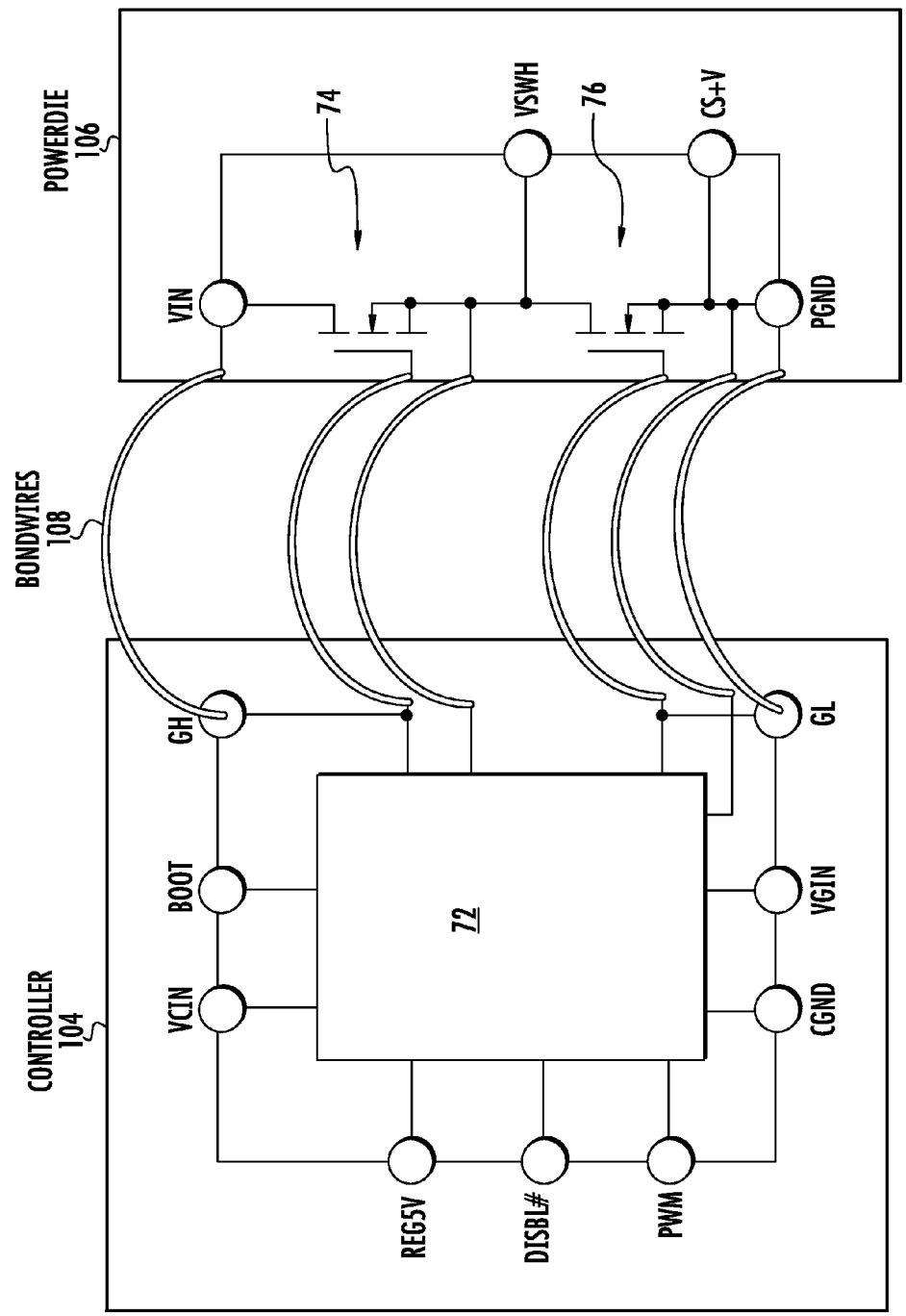
FIG. 11 is a schematic of a voltage regulator circuit including output power devices.

Turning now to some additional details, in the embodiment of FIG. 1, structure 100 is substantially self contained so that only the leadframe 102 has lead fingers 114 exposed to the outside world and contacts or solders to a printed circuit board such as the one depicted in FIG. 11 element 12. If packaged part 100 requires a large number of I/O pins and there are not enough lead fingers 114, the bottom of the packaged part 100 underneath the backside 116 can have additional pin bumps similar to that under a BGA (ball grid array) package or a stacked die package or other packages; the pin bumps provide additional signal or power connections that are exposed to the outside world.

Devices 104 and 106, however, do not necessarily have exposure to the outside world, but they are attached or mounted to the leadframe 102 in a way that they do not move. For example, in FIG. 1, device 106 underneath leadframe 102 has solder bumps 122 formed on its topside so that device 106 is physically attached to the leadframe 102 structurally. The solder bumps 122 on device 106 also serve the purpose of electrically connecting device 106 to leadframe 102 or to terminals on the underside of leadframe 102. Like device 106, in FIGS. 1 and 2, device 104 is also mounted to the leadframe 102 so that it does not move. By contrast though, the backside 124 of device 104 in FIG. 1 faces the leadframe 102, device 104 can be mounted by either conductive or non-conductive materials depending on the pattern and nature of the leadframe 102 and where the terminals 112 are located.

Figure 5:
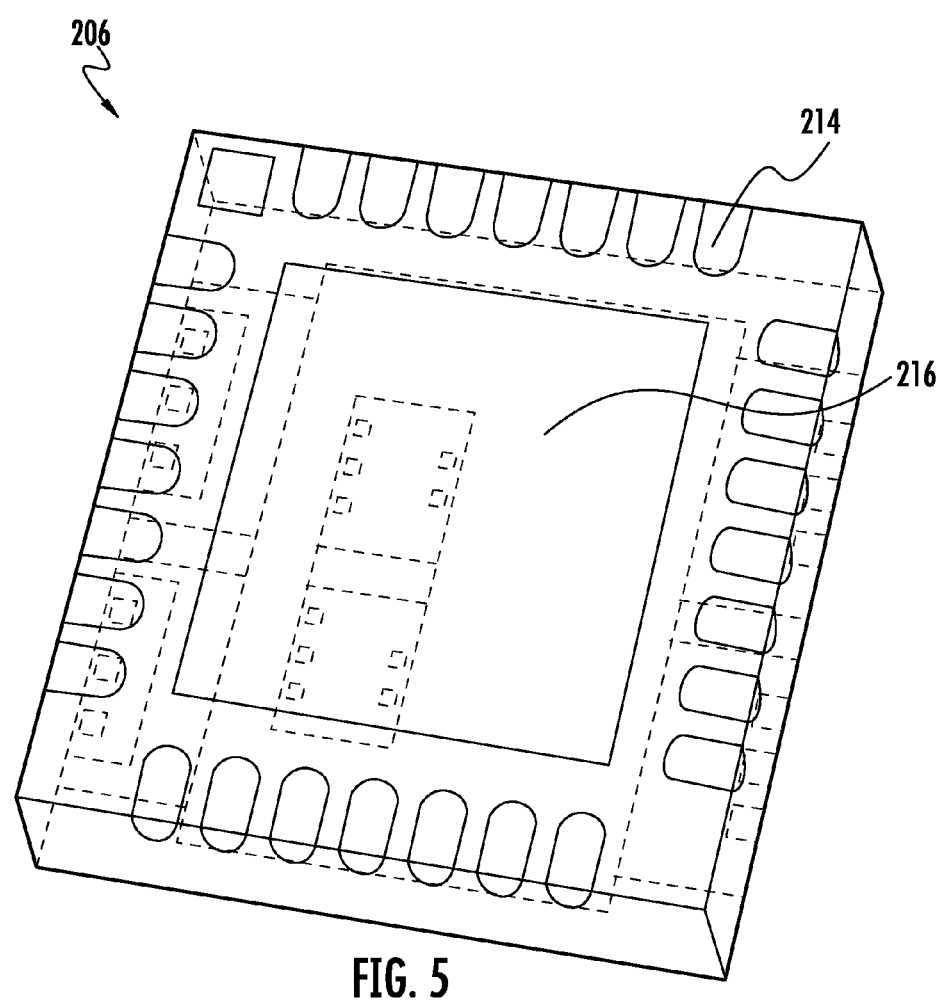
FIG. 5 is a perspective view of the backside of one embodiment of a packaged part with dual-side assembly.

In another embodiment, in FIG. 5, the backside 216 of device 206 is exposed to the outside world along with the lead fingers 214. In this embodiment, both the backside 216 and lead fingers 214 can contact or solder to a printed circuit board 12 depending on the end-use purpose or the preferences of the end-user who mounts the component 200 to a printed circuit board 12. For instance if device 206 were a circuit that dissipates much heat, the backside of device 206 should be an exposed heat sink soldered onto the board. As another example, if the application requires a very solid ground or power, the backside 216 should be soldered to a ground pad on the printed circuit board. As yet another example, if device 206 were a MEMs (microelectromechanical) device that requires particularly good physical stability, the exposed backside 216 of device 206 should be also soldered to the printed circuit board 12. In order to solder or contact both the backside 216 and terminals 214 to a printed circuit board 12, the bottom of the terminals 214 and backside 216 are located substantially on the same plane as shown in FIG. 5, or correspondingly on plane 118 in FIG. 1.

Figure 6:
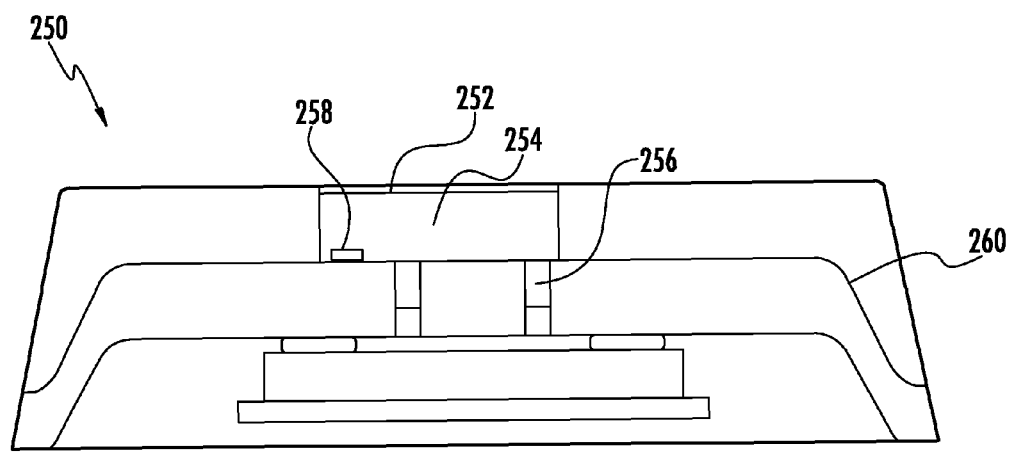
FIG. 6 is a side view, in cross section, of another embodiment of a packaged part with an exposed topside.

In another embodiment, in FIG. 6, the packaged part 250 has leadframe fingers 260 and the topside 252 of device 254 exposed to the outside world. By exposing the topside of device 254, packaged part 250 allows for air cooling or contact cooling if the device 254 included a metal heat slug or thermal pad. In addition, this configuration is also convenient for applications where devices 254 are optoelectronics or test pads for easy access or debugging. When desired, the upper device 254 can access the leadframe 260 through solder bump contacts 258 underneath device 254 or through conductive vias 256.

Figure 7:
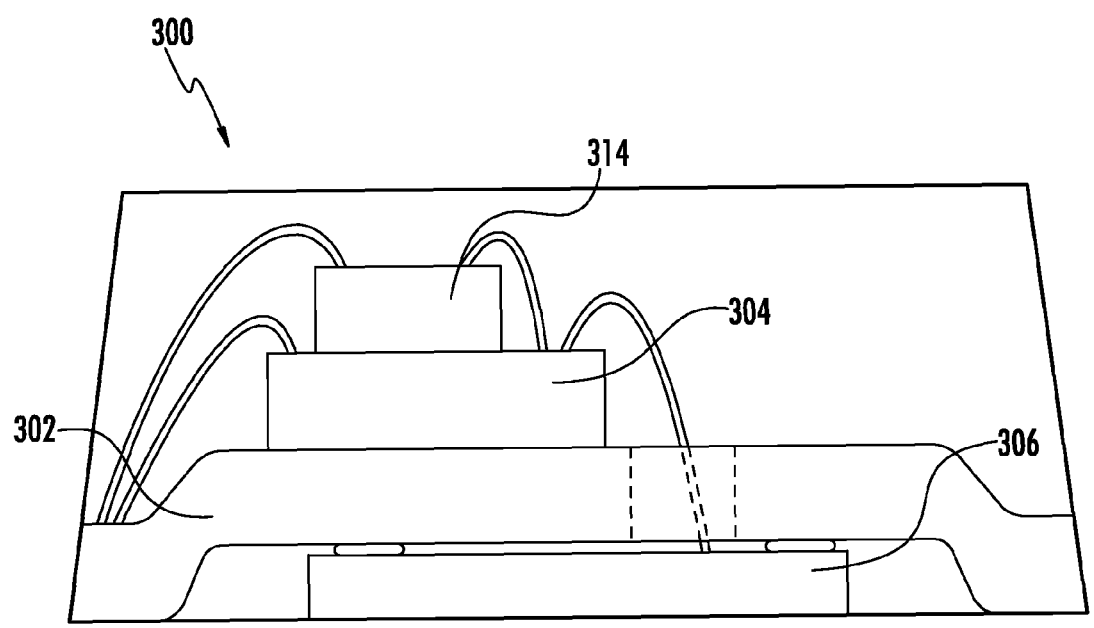
FIG. 7 is another side view, in cross section, of another embodiment of packaged part with multiple devices or circuits stacked above the leadframe.
Figure 8:
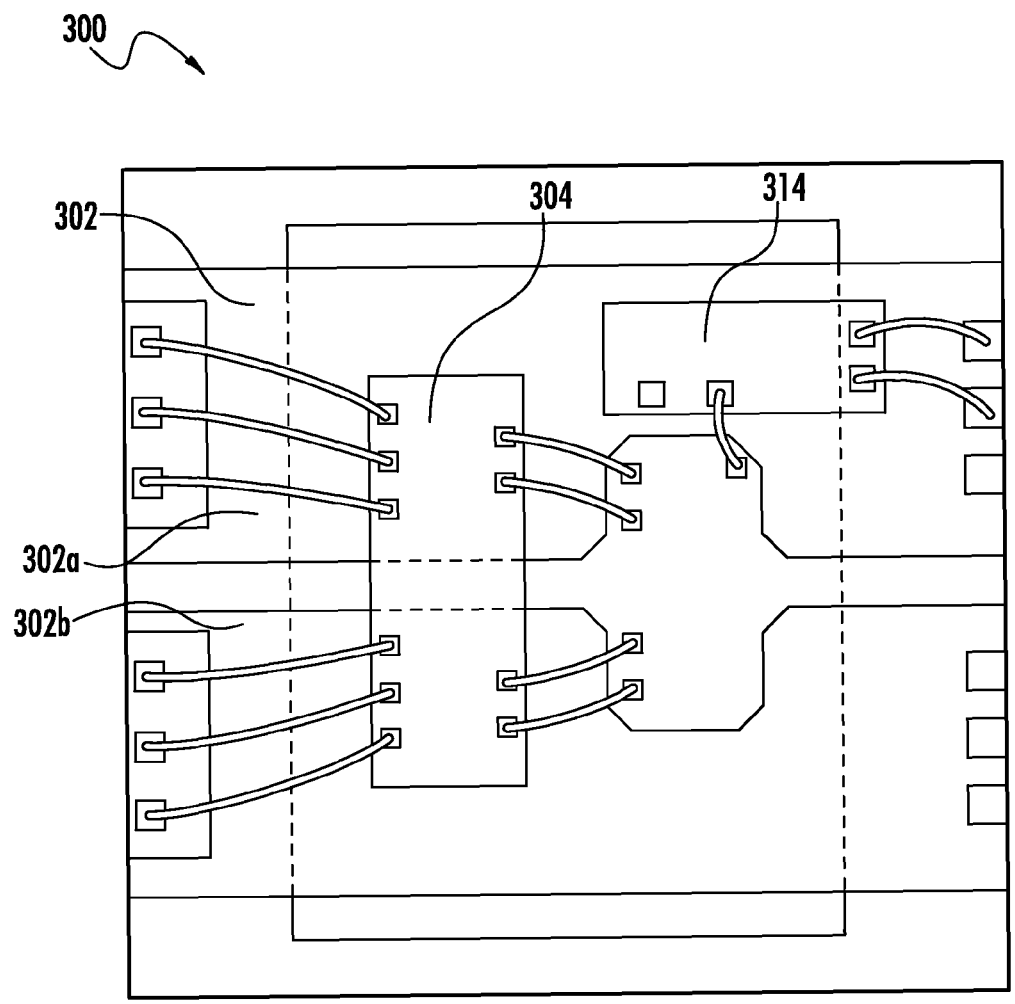
FIG. 8 is a top view of another embodiment of a packaged part with multiple devices disposed on the topside of the leadframe.

In another embodiment as shown FIG. 7, multiple devices 304 and 306 or multiple layers are formed within the package part 300. Additional devices 314 are stacked on top of device 304 as shown in FIG. 7. The additional devices 314 are mounted in a manner similar to stacked-die. In this embodiment, the object that needs more protection or is the larger heat dissipater may be placed underneath the leadframe 302, and the rest of the devices are stacked above the leadframe 302 as shown in FIG. 7. If the devices are small, instead of stacking them vertically, they could be placed adjacent to one another on the same plane as shown in another embodiment in FIG. 8. In FIG. 8, devices 304 and 314 are on top of leadframe 302 and happen to occupy one of or both leadframe halves 302a and 302b. Similarly, multiple devices could be placed adjacent to one another underneath the leadframe 302. The various devices can include active components such as transistors, circuits, MEMs, optoelectronics and other microelectronics devices. The various devices can also be passive devices such as inductors or other objects, for example, ones that are difficult to fabricate on the same die as other circuits so that it is necessary to place multiple devices in the same package.

In the foregoing and other embodiments, the connection elements like the bondwires 108 in FIGS. 1-3 may be substituted by solder bumps, solder tubes, conductive standoffs, or solder paste for connecting larger surface areas.

Figure 9:
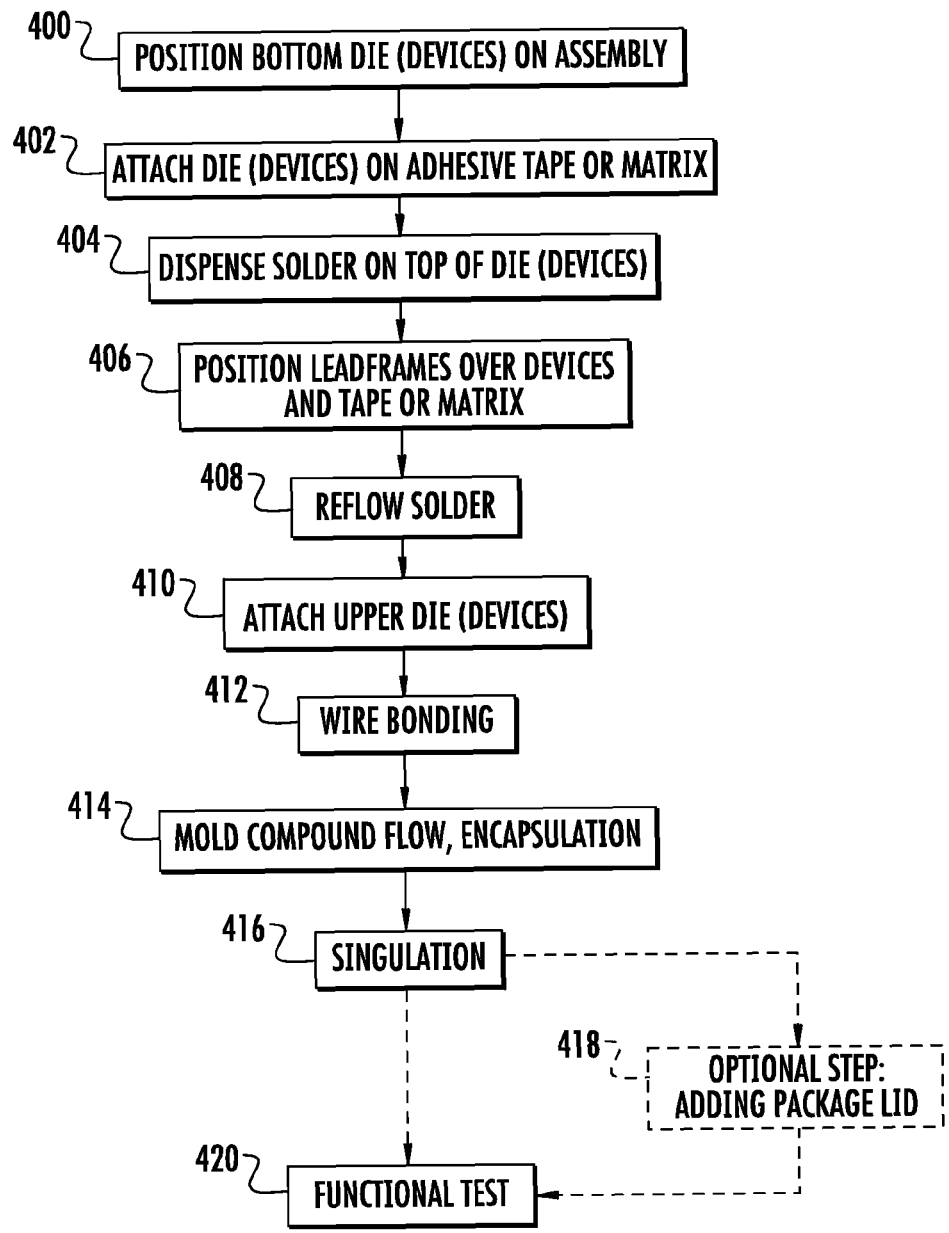
FIG. 9 is a flow chart illustrating one embodiment of a method for manufacturing an embodiment of a structure such as the one shown in FIGS. 1-3.

FIG. 9 illustrates one method of manufacturing the various embodiments of the leadframe structures and packaged parts 100. To increase throughput, the microelectronic devices are packaged many at a time in a row or in an array assembly. The leadframe structures are then singulated by cutting a large set of packages into individual parts. Unlike a configuration where a die is placed on a die attach pad (e.g. element 516 in FIG. 10), in block 400, the devices 106 are positioned on a matrix assembly, with the backsides 116 facing down on the matrix. In block 402, for alignment and placement purposes, the devices 106 are first positioned on and attached to an adhesive tape such as Kapton tape or some adhesive polymer matrix to guide the alignment and hold things in place. In block 404, solder is dispensed on top of devices 106. In block 406, the matrix of leadframes 102 is positioned over the tape and devices 106, where each leadframe 102 has an underside cavity that compensates for the height of devices 106. In block 408, the solder is reflowed so that devices 106 attach to the leadframes 102. Depending on the type of reflow process, sometimes smaller objects might float on the pool of molten solder, but the presence of the tape aids in holding and aligning the backside 116 of the devices 106 in the same plane 118 as that of the bottom of the leadframe lead fingers 114 in FIG. 1. Additional devices can be placed adjacent to each device 106 and housed within the same recess on the bottom side of each leadframe 102.

In block 410, each device 104 in FIG. 1 attaches to one or both of the top side of each leadframe half 102a and 102b usually without using a conductive attachment material (e.g. solder) but this depends on the nature of these devices. Die attach material such as an epoxy can be used. Additional devices can be attached adjacent to device 104. They may be either active or passive devices, including devices such as a mechanical heat slug or thermal pad for top exposure to the outside world.

In block 412, bondwires 108 solder to the bondpads 110 on the die 104 or 106 and terminals 112 on the leadframe 102 to form interconnections through the use of a forward bonding technique. Alternatively, it is possible to reduce the wire loop height, especially to the upper device 104, by a reverse bonding technique. Next in block 414, for environmental protection, there is encapsulation with a plastic mold compound that also flows into the space between the two leadframe halves 102*a* and 102*b,* then down to and surrounding the bottom device 106. The result of such a (cured) mold compound flow would surround both devices 104 and 106 in FIG. 1. For packaging an array of devices, the overmolding process usually covers the entire array of sites instead of individual sites. Afterwards in block 416, the sites are singulated using a wafer saw that cuts through the overmold and other material, creating individual packaged parts 100. Depending on the type of chip and application, there is an optional technique in block 418 of gluing on a lid on each site using a polymer adhesive. Then, product testing ensues in block 420. Thus, there is packaging of devices 104 and 106 on both (dual) sides of the leadframe 102, making for dual side assembly of the leadframe.

If there is no die attach pad or some type of package substrate, the devices on the bottom side of leadframe 102 have their backside 116 exposed for electrical and mechanical connection to the outside world in FIGS. 1-3. Also, on plane 118, the bottom sides of the lead fingers 114 are exposed for electrical connections to the outside world such as to a printed circuit board 12 in FIG. 10.

Figure 10:
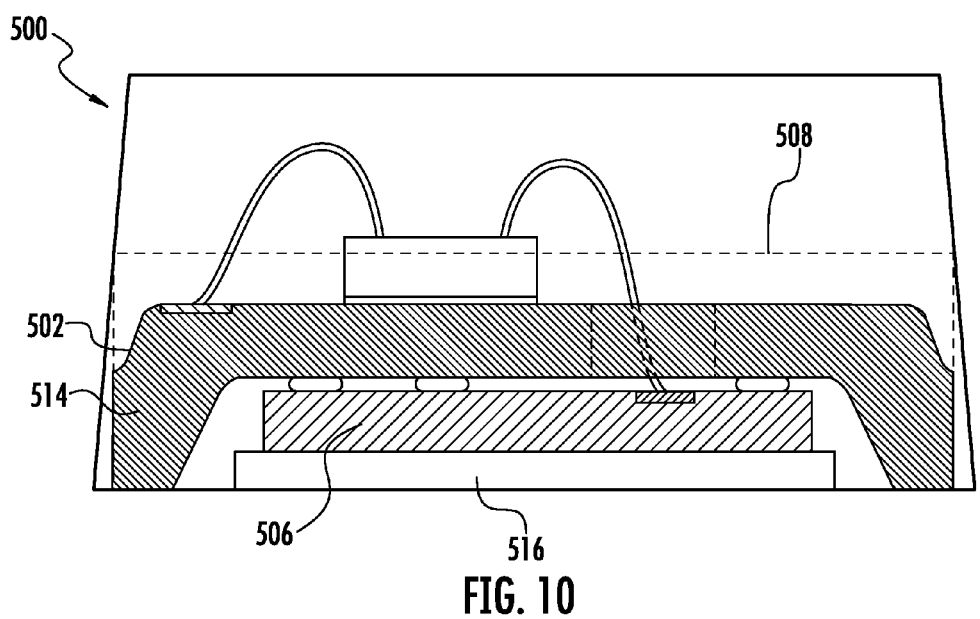
FIG. 10 is one embodiment of a packaged part where the package has a die attach.

In another embodiment of the method, instead of matrix assembly, devices and a single package are assembled individually at a time. In FIGS. 1-3, the device 106 and/or additional devices are positioned and attached to an individual pre-molded package floor or substrate or die attach pad that are found in many types of packages. FIG. 10 shows a packaged part 500 with an individual pre-made bottom package half 508 with a die attach pad 516 at the bottom of package half 508 and a leadframe 502 with leadframe fingers 514. A device 506 would first be mounted onto the die attach pad 516. Then the rest of the method to assemble the packaged part 500 is similar to the method illustrated in FIG. 9 except for block 416 where singulation is usually no longer necessary since the individual package already exists and may require only a lid. Alternatively, if each package is molded into shape, the molding is followed by punch singulation instead of sawing to produce an individual packaged part.

In power applications where device 106 in FIGS. 1-3 is a large transistor such as a power MOSFET for switching voltage regulators, there are numerous additional embodiments. As shown in the schematic in FIG. 11, a power converter can include an output circuit having a high-voltage side MOSFET device 74 that is electrically coupled to the input voltage VIN and a low-voltage side MOSFET device 76 that is electrically coupled to a ground node PGND. Together, the devices 74 and 76 can be formed on a single die (a "PowerDie") such as described in U.S. Pat. Nos. 8,168,490; 8,168,496; and/or 7,923,300 (the PowerDie Patents) The disclosures of the PowerDie Patents are incorporated herein by reference. In other embodiments, devices 74 and 76 are co-packaged using other known, or later-developed, technology. The power converter can further include other circuits such as a controller integrated circuit (IC) 72 that is fabricated on a different die that can be electrically coupled to, and co-packaged with, the PowerDie. For example, the PowerDie can be device 106 and the controller 72 can be device 104 in FIG. 1, with the leadframe 102 interposed between the two. The bondwires 108 in FIG. 1 correspond to the electrical connections between the controller 72 and the PowerDie in FIG. 11. In one embodiment, such device 106 is attached using solder on the bottom side of the leadframe 102, and device 106 straddles both halves 102*a* and 102*b* of the leadframe 102 as shown in FIGS. 2 and 3. This step is followed by another device (e.g. controller) attachment on the upper side, followed by wire bonding, encapsulation, and singulation. This configuration forms two leadframe sections 102*a* and 102*b* that correspond and connects to the high voltage side and low voltage side areas, respectively, of a power regulation device or MOSFET. Increasing the width of the conductive leadframe strips 102*a* and 102*b* lowers the resistance and improves the current carrying capability. These characteristics also improve the reliability of the overall integrated circuit and permit a higher current rating for the product.

Sometimes it is better to utilize other device configurations or multiple smaller devices such as individual PMOS FET and NMOS FET power devices rather than a single large integrated device such as a PowerDie. Consequently, the leadframe 102 can have one or more portions that are electrically isolated during patterning of the leadframe 102 or packaging singulation to accommodate a combination of thermal devices such as multiple power MOSFETs. For example, FIGS. 2 and 3 exemplify patterns where there are two leadframe halves 102*a* and 102*b* that are electrically isolated from each other. And then, there could be multiple objects placed on the lower side or multiple devices attached to the leadframe 102 on the upper side, adjacent to one another as illustrated in FIG. 8. The resultant package after singulation would have two or more leadframe sections 102*a* and 102*b* that are connected to the corresponding multiple MOSFET areas (high voltage side, low voltage side) on the devices.

For yet other power regulation circuitry, in another embodiment, the one or more devices 104 that are attached on the upper side of leadframe 102 are thermal vias, a metal slug or thermal pad that has an exposed surface after mold compound formation and encapsulation. FIG. 6 exemplifies a scenario where element 254 could be a metal slug with exposed topside 252 for cooling purposes.

Clearly, the disclosed embodiments are not exhaustive and are not limited to only power regulation circuits. Other integrated circuits or semiconductor devices can also take advantage of this type of assembly. The method shown in FIG. 9 can apply to any type of microelectronics packaging. Alternatively, in another embodiment, the device(s) 106 are attached on the bottom side of leadframe 102, followed by wire bonding, then the device(s) 104 are attached using solder on the upper side, followed by mold compound flow, encapsulation and singulation. Additionally, if the same or different devices have overlapping attachment areas across different sections of the leadframe 102 or terminals 112 or bondpads 110, this can be achieved by using multiple bondwires.

Further, the following is a description of features that are not limited to any particular type of circuitry or microelectronics or embodiment or illustrated embodiments. The leadframe design has device(s) attached in a recessed area, and the device may also attach to the leadframe terminals or to another device. The leadframe has portion(s) where one side is attached to portions of device(s) typically using an electrically conductive material, but the second side has device(s) attached to the leadframe with either conductive or non-conductive materials. The leadframe has cut-outs or openings to allow interconnections from device(s) on one side of the leadframe to device(s) on the other side. Upon array singulation, the individual leadframe structures form packaged parts with terminals and lead fingers and internal devices. The devices can have exposed surfaces on either one or both of the top and bottom sides of the packaged part. If the backside surface of the bottom device is exposed, and the bottom is taken to be the side where the package lead fingers are also exposed to the outside world, the plane of the backside should substantially coincide with the plane on the bottom of the package lead fingers. Finally, the pattern of the leadframe is not limited so that the leadframe could be segmented in multiple regions to accommodate and connect to one or more devices of different size or ratios.

Turning now to some details about the advantages of the various embodiments of the packaged part 100, first, the structures described in this application provide much flexibility in configuring the interconnections. Functional connectivity advantages include the fact that a leadframe 102 in FIGS. 1-3 performs multiple functions such as acting as a carrier and a low resistance/inductance electrical interconnect for the devices 104 and 106 that are attached to either side of leadframe 102. For example, the MOSFET or power die devices can solder directly to the leadframe carrier using multiple bondwires, thus creating a low resistance path. For switching regulators, it is also possible to attach the driver, controller, heat slugs or other devices to the leadframe so that they are in close proximity to the power MOSFET and can bond to one another through multiple paths, thus reducing resistivity and inductance. PowerDie or MOSFET devices with top and bottom surfaces that have solderable regions such as accessible gate pads can be connected to other circuits or to the leadframe 102 using bondwires 108 or solder bump/ball connections. The methods of attachment are not limited and include conductive or non-conductive epoxy or other materials. For electrical interconnection of devices or bondpads, bondwires or other solderable connections are all possible. Further, the techniques of forward and reverse wire bonding, solder ball formation, ball grid array, flip chip, wafer scale packaging, and so on are still applicable in manufacturing the various embodiments.

There are also benefits related to manufacturing costs. Although employing the leadframe 102 as interconnect, carrier and dual assembly are novel, it is still possible to adopt many of the same manufacturing techniques that are already established in order to preserve backwards compatibility for easy and inexpensive manufacturing and equipment programming. Indeed, the embodiments of the new structure can be incorporated in existing packaging techniques such as stacked die, flip chip, multi-chip modules, ball grid arrays, and so on. The embodiments also do not necessarily require revising the external package pinout to printed circuit boards so that the final assembled package remains backwards compatible with existing solutions, i.e. the external package lead configuration can remain as before. The embodiments are also scalable from a small outline to large ball grid array sized assemblies.

The manufacturing cost is further lowered because there is no mandatory need for copper clips and a large leadframe panel size. There are additional cost savings as the structure is based mostly on leadframe etching without requiring the use of an expensive stamped tooling. Moreover, leadframe etching allows flexibility in patterning.

Applications for this type of packaging include power circuits integrated with wireless communications circuits where space is limited such as in smartphones. The embodiments improve the vertical integration of power management and sensitive circuits, enhances interconnectivity, reduces resistance, tolerates more current, reduces complexity and manufacturing cost, and improves signal-to-noise ratios. Additional applications include data-communications, satellites electronics, high-end entertainment electronics, harddisk drive, and embedded biomedical devices (in humans), i.e. anything that requires good noise immunity and isolation.

Further, there is improved thermal performance because the exposed bottom die and leadframe interconnect conduct heat out of the circuits. Top side cooling is also possible.

Figure 12:
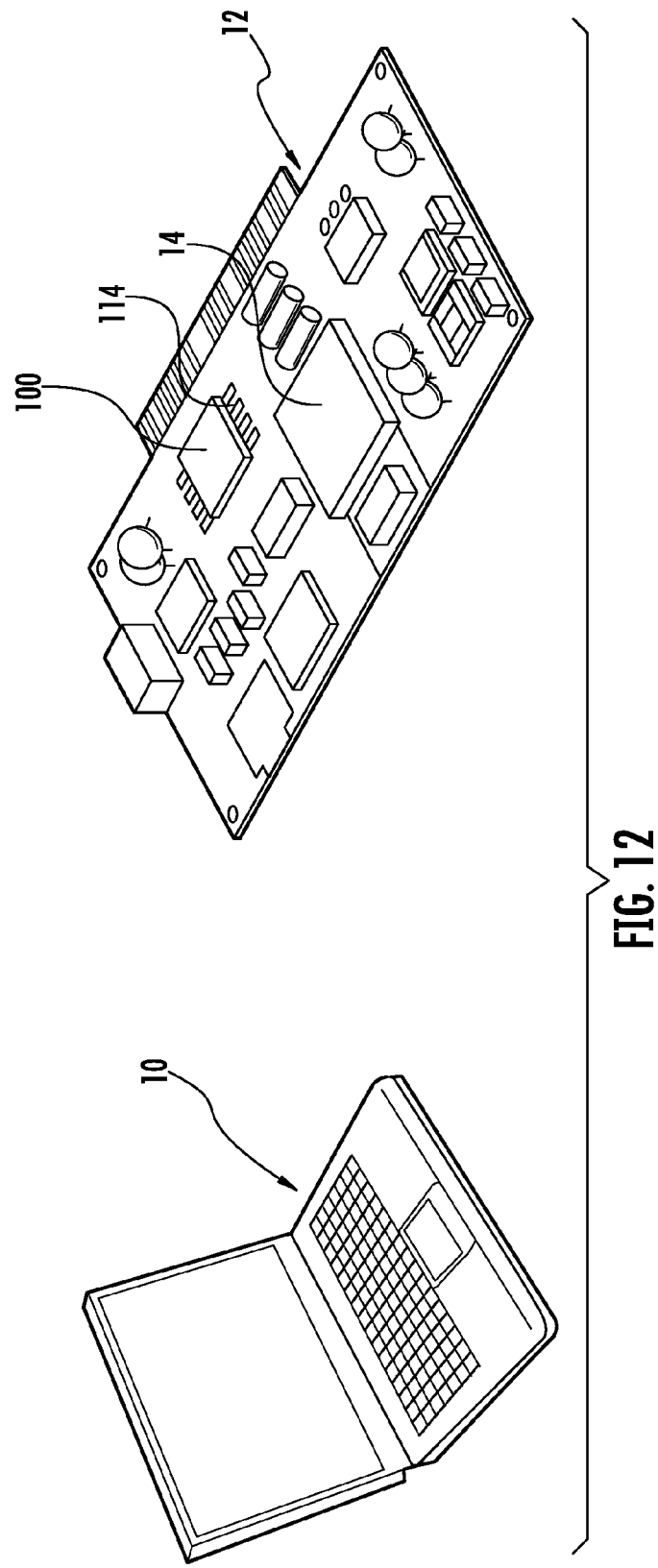
FIG. 12 is one embodiment of a computer processor that comprises packaged parts such as the one illustrated in FIGS. 1-3.

If the device comprises power circuits, then the applications include power solutions for DSP, FPGA, CPLD, any processor, DDR memory and other loads that are required in computational processing. Again, improved thermal performance helps prevent a laptop, an e-book reader, a computer, airplane or automotive control electronics, and so on from overheating. For example, FIG. 12 illustrates a laptop computer 10 that contains a printed circuit board 12. On the circuit board 12, there are various components, including a processor (CPU) chip 14 and an embodiment of a packaged part 100, such as the ones illustrated in FIGS. 1-3. In the example of FIG. 12, the part 100 has protruding leadframe fingers 114, although it could also have fingers 114 that are tucked underneath the chip 100 as is the case for the CPU chip 14. The fingers 114 are soldered to the printed circuit board 12. In this example, packaged part 100 happens to include a power regulator circuit.

Although the foregoing discussion relates mostly to packaging microelectronics such as circuits, heat slugs, transistors, etc., similar concepts apply to the packaging of other devices such as MEMs, nanotechnology, optoelectronics and so on. Other leadframe patterns are possible to accommodate these other objects. Lastly, the structure is scalable to incorporate multiple active and passive devices.

The orientation and directions stated and illustrated in this application should not be taken as limiting. For example, the directions, e.g. "top," are merely illustrative and do not orient the embodiments absolutely. That is, a structure formed on its "side" or "bottom" is merely an arbitrary orientation in space that has no absolute direction. Also, in actual electronic applications, a packaged object may well be turned on its "side" because cards and printed circuit boards are sometimes placed into a chassis or card slot and standing on their side edge. Thus, the directions are arbitrary designations.

Although specific embodiments have been illustrated and described in this patent application, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method for assembling a packaged part, the method comprising:
   positioning a first device on an adhesive guide;
   placing a recessed first side of a leadframe over the first device, wherein the leadframe is conductive;
   aligning the leadframe over the first device using the adhesive guide;
   connecting the first device directly to the leadframe using an electrically conductive material;
   mounting a second device directly to a second side of the leadframe; and
   patterning the leadframe with at least one cutout and wirebonding through the cutout an electrical connection between the first device and the second device.

2. The assembling method of claim 1 further comprising patterning the leadframe with at least one cutout and beveling corners of the at least one cutout.

3. The assembling method of claim 1 further comprising patterning the leadframe with at least one cutout and two electrically isolated pieces, a first piece defining a high voltage side and a second piece defining a low voltage side.

4. The assembling method of claim 3 further comprising electrically connecting a PowerDie to a high voltage side and also to a low voltage side; and mounting the PowerDie to the leadframe using a conductive material.

5. The assembling method of claim 1 further comprising extending the leadframe continuously across an interior width of the packaged part, and positioning the leadframe between package pinouts located on substantially opposite sides of the package.

6. The assembling method of claim 1 further comprising exposing a bottom side of the first device and locating the exposed bottom side substantially in a same plane as an exposed face of pinouts on the packaged part's bottom side.

7. A method for assembling a packaged part, the method comprising:
    positioning a first device on an adhesive guide;
    placing a recessed first side of a leadframe over the first device, wherein the leadframe is conductive;
    exposing a bottom side of the first device and locating the exposed bottom side substantially in a same plane as an exposed face of pinouts on the packaged part's bottom side;
    aligning the leadframe over the first device using the adhesive guide;
    connecting the first device directly to the leadframe using an electrically conductive material; and
    mounting a second device directly to a second side of the leadframe.

8. The assembling method of claim 7 further comprising patterning the leadframe with at least one cutout and beveling corners of the at least one cutout.

9. The assembling method of claim 7 further comprising patterning the leadframe with at least one cutout and two electrically isolated pieces, a first piece defining a high voltage side and a second piece defining a low voltage side.

10. The assembling method of claim 9 further comprising electrically connecting a PowerDie to the high voltage side and also to the low voltage side; and mounting the PowerDie to the leadframe using a conductive material.

11. The assembling method of claim 7 further comprising extending the leadframe continuously across an interior width of the packaged part, and positioning the leadframe between package pinouts located on substantially opposite sides of the package.

* * * * *